United States Patent
Jeong et al.

(10) Patent No.: US 8,951,645 B2
(45) Date of Patent: Feb. 10, 2015

(54) STACKED ORGANIC LIGHT EMITTING DEVICE HAVING HIGH EFFICIENCY AND HIGH BRIGHTNESS

(75) Inventors: Ji Weon Jeong, Daejeon (KR); Young Chul Lee, Daejeon (KR); Jeoung Kwen Noh, Yongin-si (KR); Yun Hye Hahm, Seoul (KR); Dong Seob Jeong, Daejeon (KR); Jun Gi Jang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 751 days.

(21) Appl. No.: 11/547,669

(22) PCT Filed: Apr. 7, 2005

(86) PCT No.: PCT/KR2005/001001
§ 371 (c)(1),
(2), (4) Date: Oct. 6, 2006

(87) PCT Pub. No.: WO2006/075822
PCT Pub. Date: Jul. 20, 2006

(65) Prior Publication Data
US 2007/0221912 A1    Sep. 27, 2007

(30) Foreign Application Priority Data
Apr. 9, 2004 (KR) .................. 10-2004-0024470

(51) Int. Cl.
*H01L 51/50* (2006.01)
*H01L 51/52* (2006.01)
*H01L 51/00* (2006.01)

(52) U.S. Cl.
CPC ........ *H01L 51/5278* (2013.01); *H01L 51/5036* (2013.01); *H01L 51/0072* (2013.01); *H01L 51/0076* (2013.01); *Y10S 428/917* (2013.01)
USPC ........... 428/690; 428/917; 313/504; 313/505; 313/506; 257/40; 257/E51.05; 257/E51.026; 257/E51.032

(58) Field of Classification Search
USPC .................. 428/690, 917; 313/504, 505, 506; 257/40, E51.05, E51.026, E51.032
See application file for complete search history.

(56) References Cited

U.S. PATENT DOCUMENTS 5,949,187 A * 9/1999 Xu et al. ........................ 313/504
5,998,803 A * 12/1999 Forrest et al. ................... 257/40

(Continued)

FOREIGN PATENT DOCUMENTS

EP    1 339 112 A2    8/2003
EP    1351558 B1    7/2006

(Continued)

OTHER PUBLICATIONS

C.W. Tang et al., "Organic Electroluminescent Diodes"; Journal of Applied Physics; Sep. 21, 1987; vol. 51, No. 12, pp. 913-915.

(Continued)

Primary Examiner — Gregory Clark
(74) Attorney, Agent, or Firm — McKenna Long & Aldridge LLP

(57) ABSTRACT

A stacked organic light emitting device that includes an anode connected to an external power source, a cathode connected to the external power source, at least two light emitting sections aligned between the anode and the cathode, including a light emitting layer, and an internal electrode aligned between the light emitting sections. The internal electrode is a single-layered internal electrode which is made from one selected from the group consisting of a metal, alloys of the metal, and metal oxides thereof, having a work function below 4.5 eV, each light emitting section includes an organic material layer containing an organic material having an electron affinity above 4 eV, and the organic material layer is formed between the light emitting layer of the light emitting section and the electrode facing the anode connected to the external power source in two electrodes which make contact with the light emitting section.

18 Claims, 4 Drawing Sheets

(56) References Cited

U.S. PATENT DOCUMENTS

| | | | |
|---|---|---|---|
| 6,107,734 A | 8/2000 | Tanaka et al. | |
| 6,337,492 B1* | 1/2002 | Jones et al. | 257/40 |
| 7,075,231 B1* | 7/2006 | Liao et al. | 313/506 |
| 2002/0158242 A1* | 10/2002 | Son et al. | 257/40 |
| 2003/0170491 A1* | 9/2003 | Liao et al. | 428/690 |
| 2003/0189401 A1* | 10/2003 | Kido et al. | 313/504 |
| 2004/0185297 A1* | 9/2004 | Klubek et al. | 428/690 |
| 2007/0181887 A1 | 8/2007 | Kijima et al. | |
| 2007/0182317 A1 | 8/2007 | Kido et al. | |
| 2007/0257605 A1 | 11/2007 | Son et al. | |

FOREIGN PATENT DOCUMENTS

| | | | |
|---|---|---|---|
| JP | 09-129376 | 5/1997 | |
| JP | 09-232079 | 9/1997 | |
| JP | 09-320763 | 12/1997 | |
| JP | 11-329748 | 11/1999 | |
| JP | 11-329749 | 11/1999 | |
| JP | 2001-345180 | 12/2001 | |
| JP | 2001-527688 | 12/2001 | |
| JP | 2003-45676 | 2/2003 | |
| JP | 2003-519432 | 6/2003 | |
| JP | 2003-272860 | 9/2003 | |
| JP | 2003-297575 | 10/2003 | |
| JP | 2006-503443 | 1/2006 | |
| JP | 2006-173550 | 6/2006 | |
| KR | 10-2004-0051507 | 6/2004 | |
| KR | 10-2004-0065667 | 7/2004 | |
| KR | 10-2005-0021152 | 7/2005 | |
| WO | WO 95/06400 | 3/1995 | |
| WO | WO 98/28767 | 7/1998 | |
| WO | WO 99/03158 | 1/1999 | |
| WO | WO 01/49806 | 7/2001 | |
| WO | WO 01/49806 A1 | 7/2001 | |
| WO | WO 2004105447 A1 * | 12/2004 | H05B 33/26 |

OTHER PUBLICATIONS

L.S. Hung et al., "Sputter Deposition of Cathodes in Organic Light Emitting Diodes"; Journal of Applied Physics; Oct. 15, 1999; vol. 86, No. 8, pp. 4607-4612.

Office Action of Japanese Patent Office in Appl'n No. 2011-194382, dated May 7, 2013.

Office Action of Japanese Patent Office Appl'n No. 2011-194382 dated Feb. 28, 2014.

* cited by examiner

STACKED ORGANIC LIGHT EMITTING DEVICE HAVING HIGH EFFICIENCY AND HIGH BRIGHTNESS

This application claims priority to Korean Application Nos. 10-2004-0024470 filed on Apr. 9, 2004 and International Patent Application No. PCT/KR2005/001001, both of which are incorporated by reference, as if fully set forth herein.

TECHNICAL FIELD

The present invention relates to a stacked organic light emitting device. More particularly, the present invention relates to a stacked organic light emitting device including a single-layered internal electrode aligned between stacked light emitting sections.

BACKGROUND ART

An organic light emitting device is a semiconductor device for converting electric energy into optical energy. The organic light emitting device includes two opposite electrodes (an anode and a cathode) for applying external power to the organic light emitting device and an organic material layer aligned between the anode and the cathode in order to emit light having a wavelength of the visible ray range when a hole is recombined with an electron. As a forward electric field is applied to the organic light emitting device having the above structure, holes and electrons generated from the anode and cathode are injected into the organic material layer so that the holes are combined with the electrons in the organic material layer, thereby generating excitons. When the excitons have become the ground state, light is generated. Recently, an organic material layer with a multi-layered structure (see, Applied Physics Letters, vol. 51, no. 12, pp. 913-915, 1987) has been suggested in order to allow the holes and electrons generated from the electrodes of the organic light emitting device to be effectively injected or transferred into the organic material layer. If the organic material layer is formed with the multi-layered structure, it is possible to drive the organic light emitting device with significantly reduced operational voltage while improving light emitting efficiency of the organic light emitting device.

In the meantime, various attempts have been made to realize high brightness in organic light emitting devices. For instance, a method of increasing current density obtained by applying an electric field to the organic light emitting device has been suggested. However, since an organic material layer and a thin film structure of the organic light emitting device are weak against heat, higher current density may exert a bad influence upon the organic material layer and the thin film structure of the organic light emitting device, so that the stability of the organic light emitting device may be degraded as the current density increases. For this reason, current studies are focused on organic light emitting devices representing high brightness at low current density.

There are two approaches to obtain high brightness at low current density. The first approach is to use an organic material capable of improving generation efficiency of excitons, which are generated due to recombination of holes and electrons, and/or generation efficiency of photons, which are generated when the excitons have become the ground state. The second approach is to stack at least two organic light emitting device units in series, in which each organic light emitting device unit includes an anode, a cathode and a light emitting section having a light emitting layer capable of emitting light by receiving holes and electrons from the anode and the cathode, respectively. In the following description, a term "stacked organic light emitting device" refers to the structure including at least two organic light emitting device units stacked in series. The light emitting section may include an organic material layer having a multi-layered structure including a hole injection layer, a hole transport layer, a light emitting layer and an electron transport layer, if necessary.

Methods of fabricating the above-mentioned stacked organic light emitting devices have been disclosed in various documents.

For instance, International Publication No. WO95/06400 discloses a stacked organic light emitting device including organic light emitting device units capable of emitting lights having different wavelengths such that light with desired colors can be emitted from the stacked organic light emitting device. According to the above stacked organic light emitting device, each organic light emitting device unit includes two electrodes and a light emitting layer aligned between two electrodes. In addition, the electrodes are connected to the external power source, respectively, in such a manner that the organic light emitting device units can be individually driven.

In addition, International Publication No. WO99/03158 discloses a stacked organic light emitting device including organic light emitting device units capable of emitting lights having the same wavelength such that light with improved brightness can be emitted from the stacked organic light emitting device. The stacked organic light emitting device disclosed in International Publication No. WO99/03158 has a structure similar to that of the stacked organic light emitting device disclosed in International Publication No. WO95/06400, except that the external power source is connected to both ends of the stacked organic light emitting device. That is, external electrodes of the stacked organic light emitting device are connected to the external power source and internal electrodes of the stacked organic light emitting device are disconnected from the external power source.

According to the above-mentioned stacked organic light emitting devices, internal electrodes interposed between the organic light emitting device units include an internal anode in the form of a conductive thin film electrode made from indium-tin-oxide (ITO) or Au having a high work function, and an internal cathode in the form of a metal thin film electrode made from Al (4.28 eV), Ag (4.26 eV), or Ca (2.87 eV). Thus, two-layered internal electrodes, that is, the internal anode and the internal cathode are aligned between the organic light emitting device units of the stacked organic light emitting device while making contact with each other. FIG. 1 shows such a stacked organic light emitting device including two-layered internal electrodes between the organic light emitting device units.

However, according to the stacked organic light emitting device having the structure as shown in FIG. 1, since an ITO-based transparent oxide electrode (internal anode) is formed on a metal thin film (internal cathode), to which electrons are injected, a physical bonding property between the internal anode and the internal cathode is degraded, so the two-layered internal electrodes cannot be effectively formed. In addition, if the internal anode is made from ITO, a sputtering process must be carried out due to the characteristics of the ITO. However, such a sputtering process may increase kinetic energy of atoms (<KeV) as compared with that of an evaporation process (<1eV). For this reason, if the internal anode is formed through the sputtering process by using ITO, an organic semiconductor thin film already formed may be significantly damaged (see, Journal of Applied Physics, vol. 86, no. 8, pp. 4607-4612, 1999).

In the meantime, European Patent Publication No. 1351558 A1 discloses a stacked organic light emitting device including a single-layered internal electrode made from a single non-conductor thin film having specific resistance above $10^5$ Ωcm without forming two-layered internal electrodes between stacked light emitting sections. The single non-conductor thin film is made from a material capable of simultaneously generating holes and electrons as an electric field is applied to the stacked organic light emitting device in such a manner that the holes and electrons are injected into a hole transport layer and an electron transport layer, respectively. However, the single non-conductor thin film is very expensive and a method of forming the single non-conductor thin film is very difficult.

Accordingly, it is necessary to provide a stacked organic light emitting device, which can be easily fabricated without forming two-layered internal electrodes between stacked light emitting sections.

DISCLOSURE OF THE INVENTION

Inventors of the present invention have found that, in a stacked organic light emitting device including an anode connected to an external power source, a cathode connected to the external power source, at least two light emitting sections including a light emitting layer aligned between the anode and the cathode, and an internal electrode aligned between the light emitting sections, if an organic material layer containing an organic material having an electron affinity above 4 eV is formed between the light emitting layer of the light emitting section and the internal electrode facing the anode connected to the external power source in two internal electrode which make contact with the light emitting section, it is possible to fabricate the internal electrode by using a single-layered internal electrode made from one selected from the group consisting of a metal, alloys of the metal, and metal oxides thereof, having a work function below 4.5 eV.

Accordingly, it is an object of the present invention to provide a stacked organic light emitting device including a single-layered internal electrode aligned between stacked light emitting sections.

The present invention provides a stacked organic light emitting device comprising: an anode connected to an external power source; a cathode connected to the external power source; at least two light emitting sections aligned between the anode and the cathode, including a light emitting layer; and an internal electrode aligned between the light emitting sections, wherein the internal electrode is a single-layered internal electrode which is made from one selected from the group consisting of a metal, alloys of the metal, and metal oxides thereof, having a work function below 4.5 eV, each light emitting section includes an organic material layer containing an organic material having an electron affinity above 4 eV, and the organic material layer is formed between the light emitting layer of the light emitting section and the electrode facing the anode connected to the external power source in two electrodes which make contact with the light emitting section.

Figure 1:
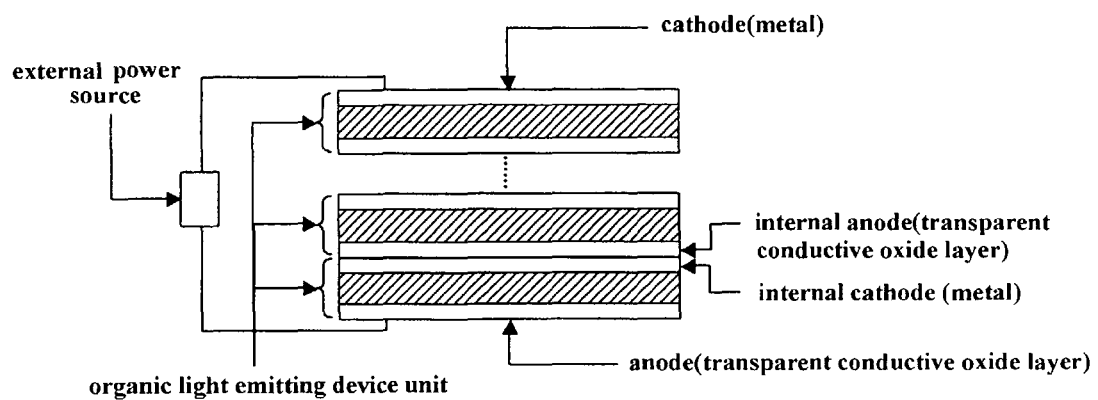
FIG. 1 is a view illustrating a structure of a conventional stacked organic light emitting device including two-layered internal electrodes formed between stacked light emitting sections.
Figure 2:
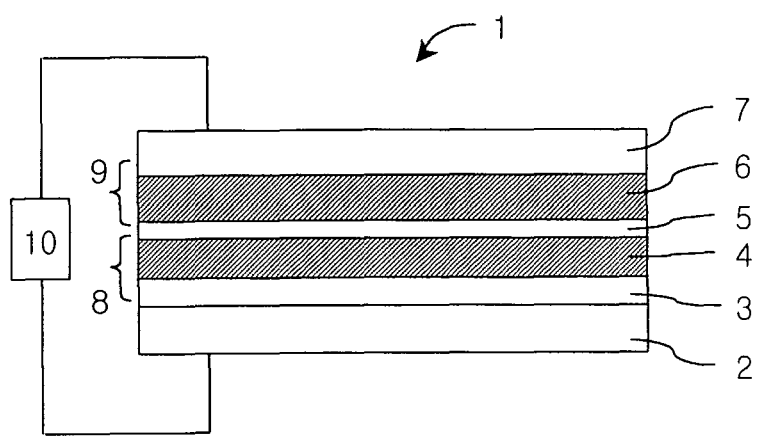
FIG. 2 is a view illustrating a structure of a stacked organic light emitting device including a single-layered internal electrode formed between stacked light emitting sections according to one embodiment of the present invention, wherein reference numerals 1 to 10 represent a stacked organic light emitting device, a glass substrate, an external anode, a first light emitting section, an internal electrode, a second light emitting section, an external cathode, first and second organic light emitting units and an external power sources, respectively.

A structure of the stacked organic light emitting device according to the present invention is shown in FIG. 2.

In addition, the present invention provides a display apparatus including the stacked organic light emitting device.

Definitions of terms used in the following description are as follows:

The light emitting section means an organic material layer unit, which is aligned between an anode and a cathode in a single organic light emitting device and includes a light emitting layer capable of emitting light by receiving holes and electrons from the anode and the cathode, respectively. The organic material layer unit is different from the organic light emitting device unit including the electrodes and the light emitting section. The light emitting section can be provided in the form of a single organic material layer acting as a light emitting layer or in the form of a multiple organic material layer including a hole injection layer, a hole transport layer, a light emitting layer, and an electron transport layer.

The internal electrode means an electrode positioned between the light emitting sections in the stacked organic light emitting device. The internal electrode is different from the external electrode positioned at an outermost portion of the stacked organic light emitting device.

The stacked organic light emitting device means a stacked structure of single organic light emitting device units including an anode connected to an external power source, a cathode connected to the external power source, at least two light emitting sections aligned between the anode and the cathode and including light emitting layers, and an internal electrode formed between the stacked light emitting sections.

In addition, "HOMO" is an abbreviation of "the highest occupied molecular orbital" and "LUMO" is an abbreviation of "the lowest unoccupied molecular orbital".

BEST MODE FOR CARRYING OUT THE INVENTION

Hereinafter, the present invention will be described in detail.

In a conventional stacked organic light emitting device, two-layered internal electrodes including an internal anode and an internal cathode, which make contact with each other, are formed between the stacked light emitting sections. In such a conventional stacked organic light emitting device, a material having a relatively high work function is used for the internal anode for the purpose of hole injection and a material having a relatively low work function is used for the internal cathode for the purpose of electron injection.

However, inventors of the present invention have found that, if an organic material layer containing an organic material having an electron affinity above 4 eV is formed in the light emitting section between the light emitting layer of the light emitting section and the electrode facing the external anode in two electrodes which make contact with the light emitting section, it is possible to fabricate the internal electrode by using a single-layered internal electrode made from one selected from the group consisting of a metal, alloys of the metal, and metal oxides thereof, having a work function below 4.5 eV.

Figure 3:
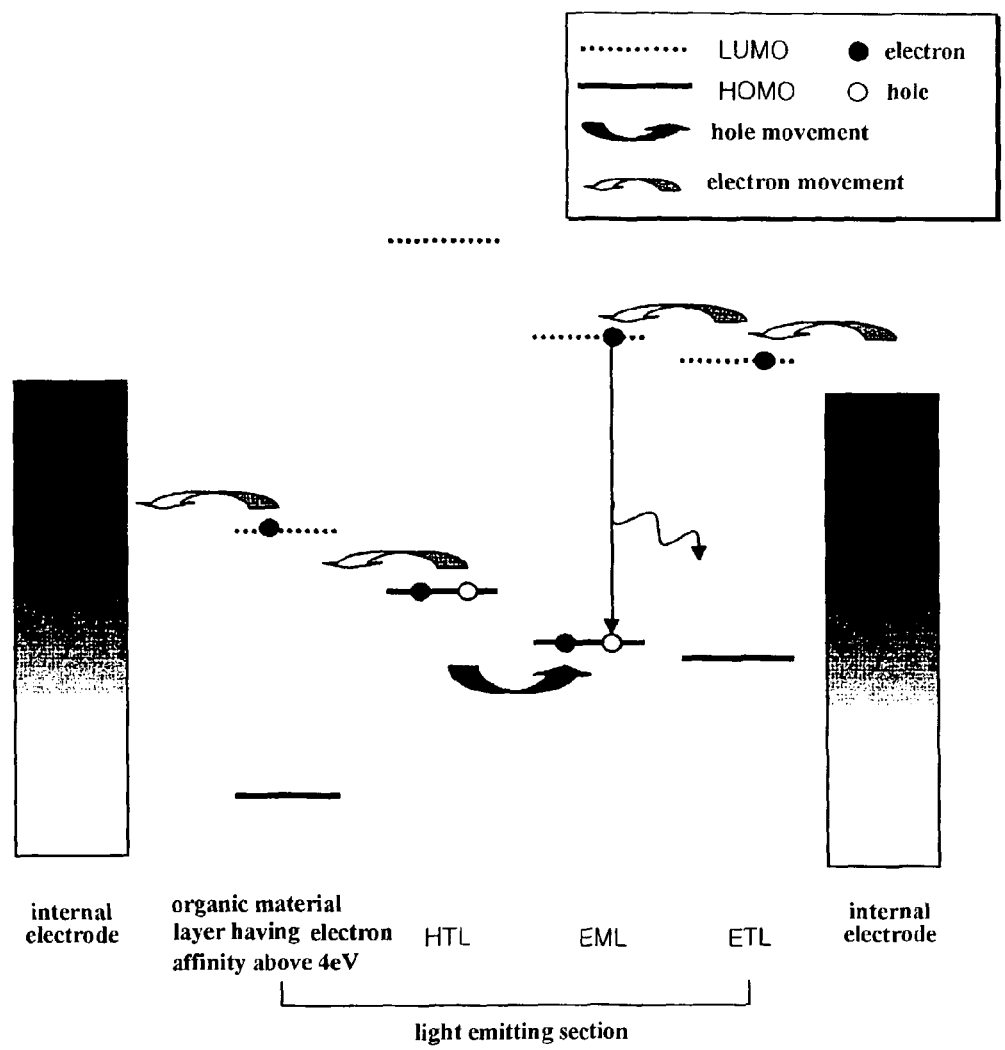
FIG. 3 is a view illustrating energy levels of organic material layers and internal electrode material formed in an organic light emitting device unit of a stacked organic light emitting device using a single-layered internal electrode according to one embodiment of the present invention.

Hereinafter, an operational principle of the present invention will be described with reference to FIG. 3.

In the present invention, a term "electron affinity" means a difference between a vacuum level and a LUMO energy level. The LUMO energy level can be calculated by adding an optical band gap to a HOMO energy level, wherein the HOMO energy level can be obtained by measuring ionization potential.

If an organic material layer containing an organic material having the electron affinity above 4 eV is formed in the light emitting section between the light emitting layer of the light emitting section and the electrode facing the external anode in two electrodes which make contact with the light emitting section, there is no great difference between the LUMO energy level of the organic material layer and the HOMO energy level of the hole transport layer or the light emitting layer in the light emitting section to which the organic material layer is adjacent (the HOMO energy level of the existing hole transport layer is set to 5.0-6.0 eV). In addition, if the organic material layer has the electron affinity above 4 eV, electrons in the HOMO energy level of the hole transport layer or the light emitting layer can be easily transferred to the organic material layer. At this time, if the electrons in the HOMO energy level of the hole transport layer or the light emitting layer are emitted, holes are generated at the very electron emitted site, i.e., in the HOMO energy level of the hole transport layer or the light emitting layer. The holes in the HOMO energy level may move to the light emitting layer through the HOMO energy level, if necessary. Accordingly, when the organic material layer is formed with an organic material having the electron affinity above 4 eV, the organic material layer may act as an anode and/or a hole injection layer. In addition, the electrons shifted into the LUMO energy level of the organic material layer having the electron affinity above 4 eV can move between molecules and have an electric conductive characteristic, so that the electrons may move toward an electrode facing the external anode due to an electric potential between the external anode and the external cathode connected to the external power source.

The reason for setting the electron affinity above 4 eV is to receive electrons from the hole transport layer or the light emitting layer positioned adjacent to the organic material layer having the electron affinity above 4 eV while injecting holes into the hole transport layer or the light emitting layer and to easily inject electrons into a metal internal electrode.

Preferably, the organic material having a high electron affinity above 4 eV ensures high carrier mobility. In this case, threshold voltage and driving voltage of the device can be lowered.

According to the operational principle as mentioned above, the organic material layer having the electron affinity above 4 eV, which is formed between the light emitting layer of the light emitting section and the electrode facing the external anode in two electrodes which make contact with the light emitting section, can act as an anode. Therefore, according to the stacked organic light emitting device of the present invention, it is possible to form a single-layered internal electrode by using a metal, alloys of the metal, or metal oxides thereof, having a work function below 4.5 eV, which are known as materials for the cathode of the organic light emitting device used for injecting electrons into the organic material layer of the organic light emitting device when external power is applied thereto, without forming a separate internal anode between the light emitting sections of the stacked organic light emitting device.

An example of the organic material having the electron affinity above 4 eV is shown in chemical formula 1.

Chemical Formula 1

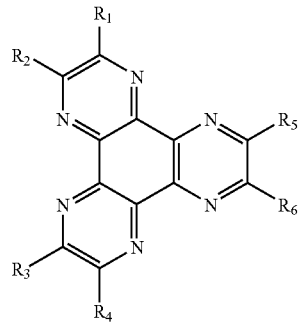

In above chemical formula 1, $R_1$ to $R_6$ are one selected from the group consisting of hydrogen, halogen atom, nitrile (—CN), nitro (—NO$_2$), sulfonyl(—SO$_2$R), sulfoxide (—SOR), sulfonamide (—SO$_2$NR$_2$), sulfonate (—SO$_3$R), trifluoromethyl(—CF$_3$), ester (—COOR), amide (—CONHR or —CONRR'), substituted or unsubstituted linear or branched $C_1$-$C_{12}$ alkoxy, substituted or unsubstituted linear or branched $C_1$-$C_{12}$ alkyl, substituted or unsubstituted aromatic or non-aromatic heterocyclic compound, substituted or unsubstituted aryl, substituted or unsubstituted mono-arylamine or de-arylamine, and substituted or unsubstituted aralkyl. In addition, R and R' are one selected from the group consisting of substituted or unsubstituted $C_1$-$C_{60}$ alkyl, substituted or unsubstituted aryl, and substituted or unsubstituted 5-7 membered heterocyclic compound.

$C_1$-$C_{60}$ alkyl, aryl and heterocyclic compound of R and R' can be substituted with at least one functional group, which is one selected from the group consisting of amine, amide, ether, and ester radicals.

In addition, aryl is one selected from the group consisting of phenyl, biphenyl, terphenyl, benzyl, naphthyl, anthracenyl, tetracenyl, pentacenyl, perylenyl, and coronenyl, which can be mono-substituted, poly-substituted or unsubstituted.

If an electron withdrawing functional group (hydrogen, halogen atom, nitrile (—CN), nitro (—NO$_2$), sulfonyl(—

$SO_2R$), sulfoxide (—SOR), sulfonamide (—$SO_2NR_2$), sulfonate (—$SO_3R$), trifluoromethyl(—$CF_3$), ester (—COOR), amide (—CONHR or —CONRR') is applied to $R_1$ to $R_6$, the electrons introduced into π-orbital of a core structure shown in chemical formula 1 are withdrawn by means of the electron withdrawing function group so that the electrons are stabilized, i.e., re-localized, thereby leveling up the electron affinity, that is, a LUMO level may drop down.

According to the present invention, it is preferred to use —CN for $R_1$ to $R_6$.

Examples and synthesis methods for above chemical formula 1 are disclosed in Korean Patent Application No. 10-2003-87159 in detail, the contents of which are incorporated herein by reference.

Another example of the organic material having the electron affinity above 4 eV includes 2,3,5,6-tetrafluoro-7,7,8,8-tetracyanoquinodimethane (F4TCNQ, LUMO energy level=5.24 eV), fluoride 3,4,9,10-perylenetetracarboxylicdianhydride (PTCDA), cyano PTCDA, naphthalenetetracarboxylicdianhydride (NTCDA), fluoride NTCDA and cyano NTCDA.

According to the present invention, the single-layered internal electrode is made from one selected from the group consisting of a metal having a work function below 4.5 eV, preferably below 4.3 eV, more preferably in a range of 3.5 eV to 4.3 eV, alloys of the metal, and metal oxides thereof. Since the single-layered internal electrode can be made from materials having a low work function, electrons are effective injected if the single-layered internal electrode is used as a cathode for the organic light emitting device.

In addition, since the metal having the work function below 4.5 eV used for the internal electrode can be melted by means of heat, the internal electrode can be formed through a thermal evaporation process instead of a sputtering process. Thus, the stacked organic light emitting device can be prevented from being damaged and a process cost can be reduced. However, all metal alloy or metal oxide having the work function below 4.5 eV is not adaptable to the thermal evaporation process. If the metal alloy or metal oxide has a high melting point, an e-beam evaporation process or a sputtering process is carried out.

The metal used for fabricating the single-layered internal electrode includes Al (4.28 eV), Ag (4.26 eV), Zn (4.33 eV), Nb (4.3 eV), Zr (4.05 eV), Sn (4.42 eV), Ta (4.25 eV), V (4.3 eV), Hg (4.49 eV), Ga (4.2 eV), In (4.12 eV), Cd (4.22 eV), B (4.4 eV), Hf (3.9 eV), La (3.5 eV), Ti (4.3 eV), a Nd or Pd alloy thereof, Ca (2.87 eV), Mg (3.66 eV), Li (2.9 eV), Na (2.75 eV), K (2.3 eV), Cs, (2.14 eV), or alloys thereof. However, the present invention is not limited to the above materials. Preferably, the single-layered internal electrode is made from one selected from the group consisting of Al (4.28 eV), Ag (4.26 eV) and alloys thereof.

The thickness of the single-layered internal electrode can be adjusted by taking transmittance of light having a wavelength of a visible ray range and electric conductivity into consideration. In detail, the single-layered internal electrode must represent superior transmittance for the light in the visible ray range in order to allow the light generated from the light emitting device to be easily emitted to an exterior. To this end, it is preferred for the internal electrode to have a thin thickness as possible. However, a thin film made from a metal may represent low electric conductivity even if the metal has superior electric conductivity. Therefore, it is necessary to adjust the thickness of the internal electrode in such a manner that the internal electrode has superior electric conductivity while representing superior transmittance for the light.

According to the present invention, the thickness of the internal electrode is preferably adjusted in a range of about 1 to 100 Å.

According to the present invention, if the light emitting section aligned adjacent to the external anode includes the organic material layer containing the organic material having the electron affinity above 4 eV between the light emitting layer of the light emitting section and the external anode, the external anode can be fabricated by using a material having a relatively low work function as used for the internal electrode, as well as a material having a relatively high work function used for the anode of the conventional organic light emitting device. Therefore, the external anode can be fabricated not only using materials used for the internal electrode, but also using a metal having a high work function, such as V, Cr, Cu, Zn, Au or an alloy thereof, metal oxides, such as Zn oxide, In oxide, ITO (indium-tin-oxide) or In—Zn oxide, a combination of a metal and oxide, such as ZnO:Al or $SnO_2$:Sb, and conductive polymer, such as poly(3-methylthiophene), poly [3,4-(ethylene-1,2-dioxy)thiophene] (PEDT), polypyrrole, or polyaniline. However, the present invention is not limited to the above materials.

According to the present invention, the external cathode can be fabricated by using a material having a relatively low work function in such a manner that electrons can be easily injected into the organic material layer. In detail, the external cathode can be fabricated not only using materials used for the internal electrode, but also using a metal, such as Mg, Ca, Na, Yt, Li, Gd, Pb or an alloy thereof, and a multi-layered material, such as LiF/Al or $LiO_2$/Al. However, the present invention is not limited to the above materials.

The stacked organic light emitting device according to one embodiment of the present invention can be fabricated through the following processes. The structure of the stacked organic light emitting device fabricated according to one embodiment of the present invention is shown in FIG. 2. As shown in FIG. 2, an anode 3 made from one of the above-mentioned anode materials is formed on a transparent glass substrate 2. Then, a first light emitting section 4 including a light emitting layer is formed on the anode 3. The light emitting section 4 can be fabricated with a multi-layered structure or a single-layered structure. The multi-layered structure may include a hole injection layer, a hole transport layer, a light emitting layer and an electron transport layer. According to the present invention, the light emitting section includes an organic material layer containing an organic material having an electron affinity above 4 eV formed between the light emitting layer of the light emitting section and the electrode facing the external anode in two electrodes which make contact with the light emitting section. As mentioned above, the organic material layer containing the organic material having the electron affinity above 4 eV plays a role of a hole injection layer or a hole transport layer. In addition, the organic material layer can be used for the purpose of hole injection and hole transportation. Then, an internal electrode 5 having a thickness in a range of about a few Å to tens of Å is formed on the light emitting section 4 by using one of the above-mentioned materials. In addition, a second light emitting section 6 is formed on the internal electrode in the same manner as the first light emitting section 4. At this time, the internal electrode and the light emitting sections can be repeatedly formed by several times, if necessary. Finally, a cathode 7 is formed on the second light emitting section 6 by using one of one of the above-mentioned cathode materials. Herein, the electrode and the light emitting section including an organic material layer can be formed through a conventional technology generally known in the art.

The stacked light emitting sections are formed in the same structure by using the same material. However, it is also possible to form the stacked light emitting sections in different structures or by using different materials.

The stacked organic light emitting device of the present invention can be fabricated in the form of a top emission type organic light emitting device, a bottom emission type organic light emitting device, or a dual emission type organic light emitting device according to materials used for the stacked organic light emitting device.

In addition, a display apparatus including the stacked organic light emitting device of the present invention can be fabricated through a conventional method generally known in the art.

Since the organic light emitting device units are connected to each other in series in the stacked organic light emitting device of the present invention, density of photons generated from the light emitting layer of each light emitting section may increase under the same current density, so that emission efficiency and brightness of light can be improved proportionally to the number of stacked light emitting sections.

In addition, according to the stacked organic light emitting device of the present invention, the light emitting section is fabricated in such a manner that it has a light emission spectrum of a color selected from red, green, blue, and a combination thereof. Thus, a light emitting device capable of emitting light having a white color or a desired color can be obtained by stacking the light emitting sections.

In the meantime, if the thickness of the light emitting section provided in the stacked organic light emitting device according to the present invention is properly adjusted, at least two overlapped optical peaks can be generated due to micro-cavity effect, so that a white light of a wide range can be produced, although it does not precisely match with the white light defined in a CRI (color rendition index). That is, if an internal electrode having a high reflective property is used, some of light generated from the light emitting section is reflected from the internal electrode without being emitted to the exterior, thereby causing light interference in the stacked organic light emitting device. In this state, if the thickness of the organic material layer provided in the light emitting section is properly adjusted, a light emitting spectrum is changed, which is called "micro-cavity effect".

In addition, since the present invention employs a single-layered internal electrode, the problem occurring in the conventional stacked organic light emitting device in relation to two-layered internal electrodes, such as poor physical bonding force between internal electrodes, may not happen. Conventionally, the organic light emitting device is easily damaged when fabricating the internal anode through the sputtering process. However, the single-layered internal electrode of the present invention can be made from a material adaptable for the evaporation process, so the stacked organic light emitting device of the present invention can be prevented from being damaged, thereby improving stability of the stacked organic light emitting device. In addition, since the present invention employs the single-layered internal electrode, the present invention represents advantages in view of the manufacturing cost and manufacturing process as compared with the conventional art employing two-layered internal electrodes, which must be bonded to each other.

Hereinafter, embodiments of the present invention will be described in detail. It should be noted that the following embodiments are for illustrative purposes only and are not intended to limit the scope of the present invention.

Embodiments

Reference Example 1

HOMO and LUMO Levels of HAT (USP and UV-VIS Absorption Schemes)

In order to detect the HOMO level of Hexanitrile hexaazatriphenylene (HAT), a UPS (Ultraviolet photoelectron spectroscopy) scheme was used. According to the UPS scheme, kinetic energy of the electrons emitted from a sample was analyzed while radiating vacuum UV line (21.20 eV) generated from a helium lamp onto the sample under an ultra high vacuum state ($<10^{-8}$ Torr), thereby detecting the work function of the metals and ionization energy of organic materials, that is the HOMO level and the Fermi energy level. When the vacuum UV line (21.20 eV) radiates onto the sample, the kinetic energy of the electrons emitted from the sample corresponds to a difference between vacuum UV energy (21.20 eV) and electron binding energy of the sample to be measured. Accordingly, the binding energy distribution of materials in the sample can be detected by analyzing the distribution of the kinetic energy of the electrons emitted from the sample. If the kinetic energy of the electron represents a maximum value, the binding energy of the sample represents a minimum value. Thus, the work function (Fermi energy level) and the HOMO level of the sample can be determined.

Figure 4:
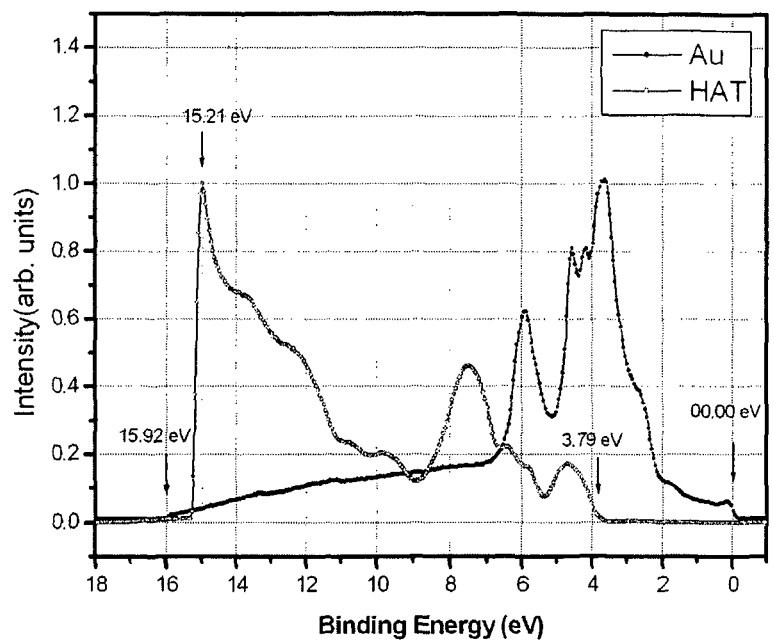
FIG. 4 is a graph illustrating UPS (ultraviolet photoelectron spectroscopy) data generated from a gold film and a HAT film formed on the gold film with a thickness of about 20 nm according to Reference Example 1.

In the reference example 1, after obtaining the work function of gold by using a gold film, the kinetic energy of the electrons emitted from a HAT film was analyzed while depositing the HAT film on the gold film, in order to obtain the HOMO level of the HAT. FIG. 4 shows UPS data generated from the gold film and the HAT film formed on the gold film with a thickness of about 20 nm. Hereinafter, the description will be made with reference to terminology disclosed in a document (H. Ishii, et al, Advanced Materials, 11, 605-625 (1999)). Binding energy shown in an x-axis of FIG. 7 was calculated based on the work function measured from the metal film. That is, the work function of gold in reference example 1 can be obtained by subtracting a maximum value (15.92 eV) of the binding energy from vacuum UV line (21.20 eV). According to reference example 1, the work function of gold was 5.28 eV. In addition, the HOMO level of the HAT can be obtained by subtracting a difference value between the maximum value (15.19 eV) and the minimum value (3.79) of the binding energy from the vacuum UV line (21.20 eV) radiated on the HAT deposited on the gold film. According to reference example 1, the HOMO level of the HAT was 9.80 eV and the Fermi level was 6.02 eV.

Figure 5:
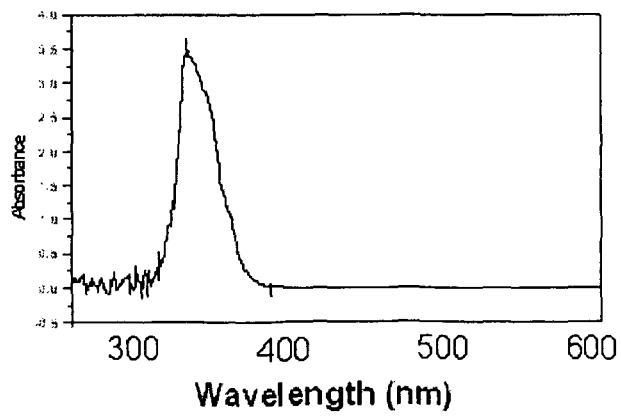
FIG. 5 is a graph illustrating a UV-VIS spectrum obtained from HAT organic material deposited on a glass surface according to Reference Example 1.

An UV-VIS spectrum as shown in FIG. 5 was obtained by using an organic material formed by depositing the HAT on a surface of glass. In addition, a band gap of 3.26 eV was obtained by analyzing an absorption edge. Thus, it is understood that the LUMO of the HAT is below 6.54 eV. The above value may vary according to exciton binding energy of the HAT film. That is, since 6.54 eV is larger than the Fermi level (6.02 eV) of the HAT film, the exciton binding energy of the HAT film must exceed 0.52 eV in order to set the LUMO level lower than the Fermi level. In general, the exciton binding energy of the organic material is 0.52 eV (maximum value thereof is lower than 1 eV), so the LUMO level of the HAT is in the range of 5.54 to 6.02 eV.

Comparative Example 1

A single organic light emitting device including a single organic light emitting section is fabricated as follows:

(1) Forming of Anode

A transparent anode having a thickness of about 1500 Å was formed on a transparent glass substrate by using ITO (indium-tin-oxide) through a sputtering process. Then, the transparent anode was subject to a plasma process by using forming gas, which was obtained by adding 4% of $H_2$ to Ar.

(2) Forming of Light Emitting Section

Hexanitrile hexaazatriphenylene (HAT) as shown in chemical formula 1a was deposited on the transparent anode through a vacuum deposition process, thereby forming a hole injection layer having a thickness of about 500 Å.

Chemical Formula 1a

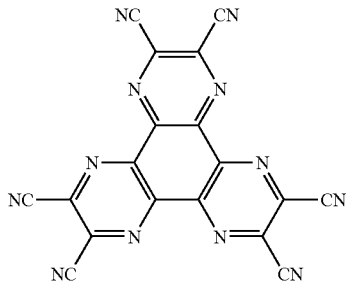

After that, NPB was deposited on the hole injection layer through a vacuum deposition process, thereby forming a hole transport layer having a thickness of about 400 Å. Then, Alq3 doped with 1% of dopant (C545T) available from Kodak company was deposited on the hole transport layer through a vacuum deposition process, thereby forming a light emitting layer having a thickness of about 300 Å. After that, a compound as shown in chemical formula 2, which is disclosed in Korean Patent Application No. 10-2002-3025, was deposited on the light emitting layer through a vacuum deposition process, thereby forming an electron transport layer having a thickness of about 200 Å.

Chemical Formula 2

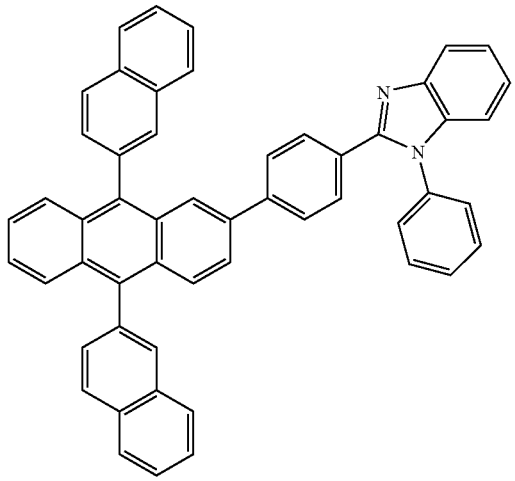

(3) Forming of Cathode

LiF and Al were sequentially deposited on the electron transport layer through an evaporation process, thereby forming a cathode.

Figure 6:
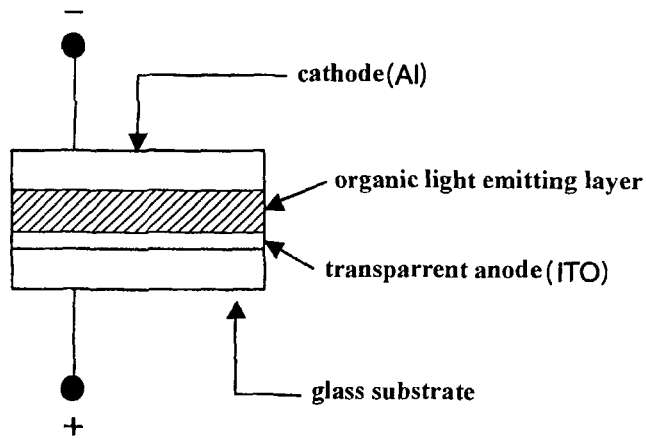
FIG. 6 is a view illustrating a structure of a single organic light emitting device according to Comparative Example 1.

A structure of an organic light emitting device fabricated through the above processes is shown in FIG. 6.

Comparative Example 2

Figure 7:
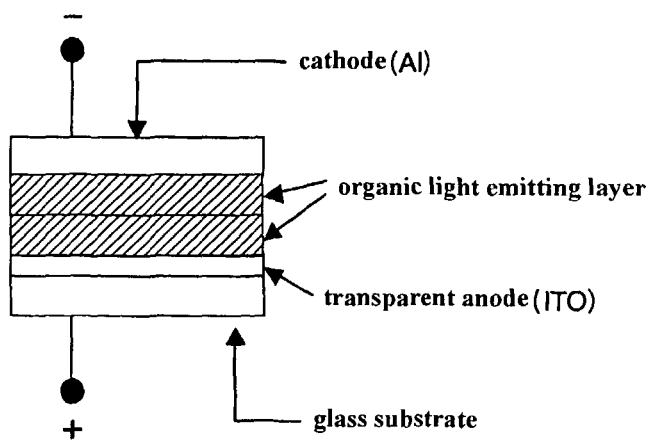
FIG. 7 is a view illustrating a structure of an organic light emitting device according to Comparative Example 2, in which the organic light emitting device includes two-layered light emitting sections without forming an internal electrode therebetween.

According to comparative example 2, the organic light emitting device was fabricated by performing the process identical to that of comparative example 1, except that the process for forming the light emitting section was repeated by two times. Therefore, the stacked organic light emitting device included two light emitting sections without forming an internal electrode (an internal cathode (Al) and an internal anode (ITO)). A structure of the stacked organic light emitting device fabricated through the above processes is shown in FIG. 7.

Comparative Example 3

Figure 8:
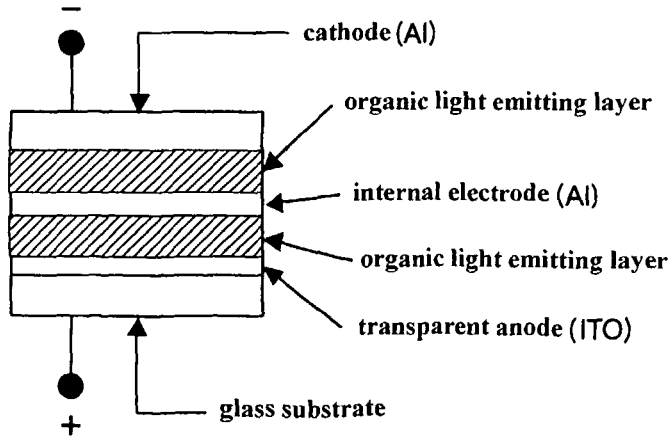
FIG. 8 is a view illustrating a structure of a stacked organic light emitting device according to Example 1, in which a single-layered internal electrode is formed between two-layered light emitting sections.

According to comparative example 3, the organic light emitting device was fabricated by performing the process identical to that of comparative example 1, except that the process for forming the organic light emitting section was repeated by two times, in which a single layered internal electrode having a thickness of about 60 Å was formed by using Al after forming a first light emitting section, and then, a second light emitting section was formed without forming a HAT organic material layer. Thus, the organic light emitting device of comparative example 3 included two light emitting sections and an internal electrode made from AL interposed between two light emitting sections, in which the internal electrode did not include an internal anode (ITO) and the HAT organic material layer was omitted from the second light emitting section. A structure of the stacked organic light emitting device fabricated through the above processes is shown in FIG. 8.

Example 1

According to example 1, the organic light emitting device was fabricated by performing the process identical to that of comparative example 1, except that a single layered internal electrode having a thickness of about 60 Å was formed by using Al after forming a first light emitting section, and then, a second light emitting section was formed. Thus, the organic light emitting device of example 1 included two light emitting sections and an internal electrode made from AL interposed between two light emitting sections, in which the second light emitting section had a HAT organic material layer. A structure of the stacked organic light emitting device fabricated through the above processes is shown in FIG. 8.

Test Result

In a case of the single organic light emitting device of comparative example 1, current density of 10 mA/cm$^2$ was represented under applied voltage of 3.9V. At this time, a light emitting efficiency was 7.9 cd/A, and brightness was 790 cd/m$^2$. In a case of the stacked organic light emitting device of comparative example 2, which does not include the internal electrode, current density of 10 mA/cm$^2$ was represented under applied voltage of 8.7V. At this time, a light emitting efficiency was 7.4 cd/A, and brightness was 742 cd/m$^2$. In a case of the stacked organic light emitting device of comparative example 3, in which the second light emitting section did not include the HAT organic material layer, current density of 10 mA/cm$^2$ was represented under applied voltage of 16.5V. At this time, a light emitting efficiency was 5 cd/A, and brightness was 500 cd/m$^2$. In addition, in a case of the stacked organic light emitting device of example 1, similarly to comparative example 2, current density of 10 mA/cm² was represented under applied voltage of 8.7V. At this time, a light emitting efficiency was 13.8 cd/A, and brightness was 1380 cd/m². Table 1 shows the above test result.

TABLE 1

|  | Current density | Applied voltage | Light emitting efficiency | Brightness |
| --- | --- | --- | --- | --- |
| Comparative example 1 | 10 mA/cm² | 3.9 V | 7.9 cd/A | 790 cd/m² |
| Comparative example 2 | 10 mA/cm² | 8.7 V | 7.4 cd/A | 742 cd/m² |
| Comparative example 3 | 10 mA/cm² | 16.5 V | 5 cd/A | 500 cd/m² |
| Example 1 | 10 mA/cm² | 8.7 V | 13.8 cd/A | 1380 cd/m² |

In the case of the organic light emitting device of comparative example 2, in which the thickness of the stacked light emitting sections was enlarged by two times as compared with that of the comparative example 1 because the light emitting sections were stacked without forming the internal electrode therebetween, although applied voltage thereof was increased by approximately two times as compared with that of comparative example 1 in order to obtain the same current density thereof as that of comparative example 1, the light emitting efficiency and brightness thereof were similar to those of comparative example 1. It can be understood from the above result that, if the thickness of the organic material layer of the organic light emitting device is simply enlarged, the driving voltage must be increased in order to obtain the same current density, light emitting efficiency and brightness.

The light emitting efficiency and brightness of the stacked organic light emitting device according to example 1 were increased by two times as compared with those of the single light emitting device of comparative example 1 and the stacked organic light emitting device of comparative example 1, which did not includes the internal electrode. In addition, when comparing example 1 with comparative example 3, it can be understood that the driving voltage is lowered and the light emitting efficiency and brightness are improved if the organic material layer having the electron affinity above 4 eV is interposed between the internal electrode and the light emitting layer, even if the internal electrode includes only the internal cathode without the internal anode. In addition, it can be understood from the above result that the single layered internal electrode interposed between the two light emitting sections and the organic material layer having the electron affinity above 4 eV may act as the internal anode and the internal cathode with respect to each of the stacked light emitting sections. That is, the single layered internal electrode and the organic material layer having the electron affinity above 4 eV may act as the hole injection layer and the electron injection layer.

INDUSTRIAL APPLICABILITY

As described above, according to the stacked organic light emitting device of the present invention, the light emitting efficiency and bright are improved proportionally to the number of stacked light emitting sections, and desired light can be emitted according to wavelengths of the light emitting sections. In addition, since the stacked organic light emitting device of the present invention includes the single layered internal electrode, the stacked organic light emitting device of the present invention can be easily fabricated at a low cost as compared with the conventional organic light emitting device having the two-layered internal electrodes. Furthermore, since it is not necessary to use materials adaptable for the sputtering process when forming the internal electrode, the stability of the stacked organic light emitting device according to the present invention can be improved.

The invention claimed is:

1. A stacked organic light emitting device comprising:
an anode connected to an external power source;
a cathode connected to the external power source;
at least two light emitting sections aligned between the anode and the cathode, each light emitting section including a light emitting layer; and
an internal electrode aligned between the light emitting sections, wherein
the internal electrode is a single-layered internal electrode consisting of a metal or a metal alloy, having a work function below 4.5 eV,
wherein one of the at least two light emitting sections includes an organic material layer containing an organic material having an electron affinity above 4 eV, and
wherein the organic material layer is formed between the light emitting layer of the one of the at least two light emitting sections and the internal electrode.

2. The stacked organic light emitting device as claimed in claim 1, wherein the organic material having the electron affinity above 4 eV is a compound having a chemical formula as shown below,

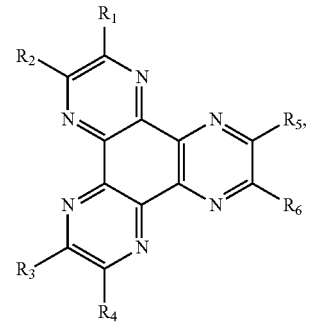

wherein, $R_1$ to $R_6$ are one selected from the group consisting of hydrogen, halogen atom, nitrile (—CN), nitro (—NO$_2$), sulfonyl (—SO$_2$R), sulfoxide (—SOR), sulfonamide (—SO$_2$NR$_2$), sulfonate (—SO$_3$R), trifluoromethyl (—CF$_3$), ester (—COOR), amide (—CONHR or —CONRR'), substituted or unsubstituted linear or branched $C_1$-$C_{12}$ alkoxy, substituted or unsubstituted linear or branched $C_1$-$C_{12}$ alkyl, substituted or unsubstituted aromatic or non-aromatic heterocyclic compound, substituted or unsubstituted aryl, substituted or unsubstituted mono-arylamine or de-arylamine, and substituted or unsubstituted aralkyl, and R and R' are one selected from the group consisting of substituted or unsubstituted $C_1$-$C_{60}$ alkyl, substituted or unsubstituted aryl, and substituted or unsubstituted 5-7 membered heterocyclic compound.

3. The stacked organic light emitting device as claimed in claim 2, wherein $R_1$ to $R_6$ are nitrile (—CN).

4. The stacked organic light emitting device as claimed in claim 1, wherein the internal electrode is made from at least one selected from the group consisting of Al (4.28 eV), Ag (4.26 eV), Zn (4.33 eV), Nb (4.3 eV), Zr (4.05 eV), Sn (4.42 eV), Ta (4.25 eV), V (4.3 eV), Hg (4.49 eV), Ga (4.2 eV), In (4.12 eV), Cd (4.22 eV), B (4.4 eV), Hf (3.9 eV), La (3.5 eV), Ti (4.3 eV), Ca (2.87 eV), Mg (3.66 eV), Li (2.9 eV), Na (2.75 eV), K (2.3 eV), Cs, (2.14 eV), and alloys thereof.

5. The stacked organic light emitting device as claimed in claim 1, wherein each of the stacked light emitting sections has a light emission spectrum of a color selected from red, green, blue, and combination thereof, so that the stacked organic light emitting device is able to emit white light.

6. The stacked organic light emitting device as claimed in claim 1, wherein the stacked organic light emitting device is able to emit a white light of a wide range due to a micro-cavity effect.

7. The stacked organic light emitting device as claimed in claim 1, wherein the organic material having the electron affinity above 4 eV is one selected from the group consisting of 2,3,5,6-tetrafluoro-7,7,8,8-tetracyanoquinodimethane, fluoride 3,4,9,10-perylenetetracarboxylicdianhydride (PTCDA), cyano PTCDA, naphthalenetetracarboxylicdianhydride (NTCDA), fluoride NTCDA and cyano NTCDA.

8. The stacked organic light emitting device as claimed in claim 1 further comprising:
at least three light emitting sections, and
at least two internal electrodes.

9. The stacked organic light emitting device of claim 8, wherein two of the at least three light emitting sections each includes a light emitting layer and an organic material layer, the organic material layer containing an organic material having an electron affinity above 4 eV, and
wherein each organic material layer is formed between the light emitting layer of the corresponding light emitting section and one of the at least two internal electrodes.

10. The stacked organic light emitting device of claim 1, wherein all but one of the at least two light emitting sections each includes a light emitting layer and an organic material layer containing an organic material having an electron affinity above 4 eV, and
wherein each organic material layer is formed between the light emitting layer of the corresponding light emitting section and an internal electrode.

11. The stacked organic light emitting device of claim 1, wherein another of the at least two light emitting sections is located between the internal electrode and anode.

12. A display apparatus comprising a stacked organic light emitting device as claimed in claim 1.

13. The display apparatus as claimed in claim 12, wherein the internal electrode is made from at least one selected from the group consisting of AL (4.28 eV), Ag (4.26 eV), Zn (4.33 eV), Nb (4.3 eV), Zr (4.05 eV), Sn (4.42 Ev), Ta (4.25 eV) V (4.3 eV), Hg (4.49 eV), Ga (4.2 eV), In (4.12 eV) Cd (4.22 eC), B (4.4 eV), Hf (3.9 eV), La (3.5 eV), Ti (4.3 eV), Ca (2.87 eV), Mg (3.66 eV), Li (2.9 eV), Na (2.75 eV), K (2.3 eV), Cs, (2.14 eV), and alloys thereof.

14. The display apparatus as claimed in claim 12, wherein each of the stacked light emitting sections has a light emission spectrum of a color selected from red, green, blue, and combination thereof, so that the stacked organic light emitting device is able to emit white light.

15. The display apparatus as claim in claim 12, wherein the stacked organic light emitting device is able to emit a white light of a wide range due to a micro-cavity effect.

16. The display apparatus as claimed in claim 12, wherein the organic material having the electron affinity above 4 eV is a compound having a chemical formula as shown below,

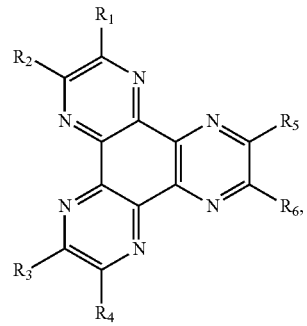

wherein, $R_1$ to $R_6$ are one selected from the group consisting of hydrogen, halogen atom, nitrile (—CN), nitro (—NO$_2$), sulfonyl (—SO$_2$R), sulfoxide (—SOR), sulfonamide (—SO$_2$NR$_2$), sulfonate (—SO$_3$R), trifluoromethyl (—CF$_3$), ester (—COOR), amide (—CONHR or —CONRR'), substituted or unsubstituted linear or branched $C_1$-$C_{12}$ alkoxy, substituted or unsubstituted linear or branched $C_1$-$C_{12}$ alkyl, substituted or unsubstituted aromatic or non-aromatic heterocyclic compound, substituted or unsubstituted aryl, substituted or unsubstituted mono-arylamine or de-arylamine, and substituted or unsubstituted aralkyl, and R and R' are one selected from the group consisting of substituted or unsubstituted $C_1$-$C_{60}$ alkyl, substituted or unsubstituted aryl, and substituted or unsubstituted 5-7 membered heterocyclic compound.

17. The display of apparatus as claimed in claim 16, wherein $R_1$ to $R_6$ are nitrile (—CN).

18. The display apparatus as claimed in claim 12, wherein the organic material having the electron affinity above 4 eV is one selected from the group consisting of 2,3,5,6-tetrafluoro-7,7,8,8-tetracyanoquinodimethane, fluoride 3,4,9,10-perylenetetracarboxylidianhydride (PTCDA), cyano PTCDA, naphthalenetetracarboxylicdianhydride (NTCDA), fluoride NTCDA and cyano NTCDA.

* * * * *